United States Patent
Tan et al.

(10) Patent No.: US 7,061,124 B2
(45) Date of Patent: *Jun. 13, 2006

(54) SOLDER MASKS INCLUDING DAMS FOR AT LEAST PARTIALLY SURROUNDING TERMINALS OF A CARRIER SUBSTRATE AND RECESSED AREAS POSITIONED ADJACENT TO THE DAMS, AND CARRIER SUBSTRATES INCLUDING SUCH SOLDER MASKS

(75) Inventors: Cher Khng Victor Tan, Singapore (SG); Choon Kuan Lee, Singapore (SG); Kian Chai Lee, Singapore (SG); Guek Har Lim, Singapore (SG); Wuu Yean Tay, Singapore (SG); Teck Huat Poh, Singapore (SG); Cheng Poh Pour, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.
This patent is subject to a terminal disclaimer.

(21) Appl. No.: 10/936,304

(22) Filed: Sep. 7, 2004

(65) Prior Publication Data
US 2005/0029676 A1 Feb. 10, 2005

Related U.S. Application Data

(63) Continuation of application No. 10/120,169, filed on Apr. 10, 2002, now Pat. No. 6,787,923.

(30) Foreign Application Priority Data
Feb. 4, 2002 (SG) ............................. 200201827

(51) Int. Cl.
*H01L 23/48* (2006.01)
*H01L 23/52* (2006.01)
*H01L 29/40* (2006.01)

(52) U.S. Cl. .................................... 257/782; 257/779
(58) Field of Classification Search ................ 257/779, 257/782
See application file for complete search history.

(56) References Cited

U.S. PATENT DOCUMENTS 5,041,395 A 8/1991 Steffen (Continued)

OTHER PUBLICATIONS

Miller et al., "Maskless Mesoscale Materials Deposition", Deposition Technology, Sep. 2001, pp. 20-22.

(Continued)

*Primary Examiner*—Howard Weiss
(74) *Attorney, Agent, or Firm*—TraskBritt

(57) ABSTRACT

A solder mask for use on a carrier substrate includes a device-securing region positionable over at least a portion of a die-support location of the carrier substrate. Dams of the solder mask are positionable laterally adjacent to at least portions of the peripheries of corresponding terminals of the carrier substrate. A carrier substrate includes at least one die-attach location and one or more terminals that protrude from a surface of the carrier substrate so as to prevent adhesive material from contaminating connection surfaces thereof. The solder may be positioned or formed on the carrier substrate. The carrier substrate and solder mask may each include one or more recessed areas that laterally surround at least portions of their die-attach location and device-securing region, respectively, to receive excess adhesive.

23 Claims, 4 Drawing Sheets

U.S. PATENT DOCUMENTS

| | | | |
|---|---|---|---|
| 5,239,131 A | | 8/1993 | Hoffman et al. |
| 5,336,931 A | * | 8/1994 | Juskey et al. ............... 257/787 |
| 5,409,863 A | | 4/1995 | Newman |
| 5,558,267 A | | 9/1996 | Humphrey et al. |
| 5,744,084 A | | 4/1998 | Chia et al. |
| 5,917,234 A | | 6/1999 | Tsuruzono |
| 6,020,218 A | | 2/2000 | Shim et al. |
| 6,232,650 B1 | | 5/2001 | Fujisawa et al. |
| 6,251,488 B1 | | 6/2001 | Miller et al. |
| 6,259,962 B1 | | 7/2001 | Gothait |
| 6,268,584 B1 | | 7/2001 | Keicher et al. |
| 6,331,451 B1 | | 12/2001 | Fusaro et al. |
| 6,391,251 B1 | | 5/2002 | Keicher et al. |
| 6,395,998 B1 | | 5/2002 | Farquhar et al. |
| 6,400,007 B1 | | 6/2002 | Wu et al. |
| 6,426,565 B1 | | 7/2002 | Bhatt et al. |
| 6,448,507 B1 | | 9/2002 | Fontecha et al. |
| 6,479,887 B1 | | 11/2002 | Yoon et al. |
| 6,593,220 B1 | | 7/2003 | Yu et al. |
| 6,608,375 B1 | | 8/2003 | Terui et al. |
| 6,787,923 B1 | * | 9/2004 | Tan et al. ................... 257/779 |
| 2001/0010947 A1 | | 8/2001 | Hsu et al. |
| 2002/0171177 A1 | | 11/2002 | Kritchman et al. |
| 2003/0043360 A1 | | 3/2003 | Farnworth |
| 2003/0052419 A1 | | 3/2003 | Ujiie et al. |
| 2003/0151167 A1 | | 8/2003 | Kritchman et al. |
| 2003/0207213 A1 | | 11/2003 | Farnworth |

OTHER PUBLICATIONS

Miller, "New Laser-Directed Deposition Technology", Microelectronic Fabrication, Aug. 2001, p. 16.

U.S. Appl. No. 10/191,424, filed Jul. 8, 2002, entitled "Semiconductor Devices With Permanent Polymer Stencil and Method for Manufacturing the Same", inventor Farnworth et al.

U.S. Appl. No. 10/201,208, filed Jul. 22, 2002, entitled Thick Solder Mask for Confining Encapsulant Material Over Selected Locations of a Substrate, Assemblies Including the Solder Mask, and Methods, inventor Grigg et al.

U.S. Appl. No. 10/370,755, filed Feb. 20, 2003, entitled "Chip Scale Package Structures and Method of Forming Conductive Bumps Thereon", inventor Warren M. Farnworth.

U.S. Appl. No. 10/672,098, filed Sep. 26, 2003, entitled "Apparatus and Methods for Use in Stereolithographic Processing of Components and Assemblies", inventor Warren M. Farnworth.

U.S. Appl. No. 10/688,354, filed Oct. 17, 2003, entitled "Thick Solder Mask for Confining Encapsulant Material Over Selected Locations of a Substrate and Assemblies Including the Solder Mask", inventor Grigg et al.

Webpage, How it Works, Objet Prototyping the Future, 2 pages (2003).

Webpage, Photopolymer materials and Support Resins, Objet Prototyping the Future, Objet FullCure 700 Series, 2 pages (2003).

Webpage, How it Works, Objet Prototyping the Future, 2 pages (2003).

* cited by examiner

SOLDER MASKS INCLUDING DAMS FOR AT LEAST PARTIALLY SURROUNDING TERMINALS OF A CARRIER SUBSTRATE AND RECESSED AREAS POSITIONED ADJACENT TO THE DAMS, AND CARRIER SUBSTRATES INCLUDING SUCH SOLDER MASKS

CROSS-REFERENCE TO RELATED APPLICATION

This application is a continuation of application Ser. No. 10/120,169 filed Apr. 10, 2002, now U.S. Pat. No. 6,787,923, issued Sep. 7, 2004.

BACKGROUND OF THE INVENTION

1. Field of the Invention

The present invention relates generally to solder masks for use on carrier substrates and, more particularly, to solder masks that are configured to prevent excess adhesive material from contacting or covering terminals of carrier substrates. In addition, the present invention relates to carrier substrates including such solder masks and to semiconductor device assemblies and packages including the carrier substrates. The present invention also relates to methods for designing solder masks to be used on carrier substrates, to methods for forming solder masks on carrier substrates, and to methods for connecting semiconductor devices to carrier substrates.

2. Background of Related Art

Circuit boards and other carrier substrates have long been employed to establish electrical communication between bond pads of semiconductor dice and other electronic components, including those carried by the circuit board and components that are external to the circuit board.

Conventionally, relatively small circuit boards have been used to package one or more semiconductor dice, which protects the dice and provides a semiconductor device package that includes a standardized connection pattern, regardless of the arrangement of bond pads of each semiconductor die of such a package. These circuit boards are often referred to in the art as "interposers." In the state of the art, the dimensions of interposers are approaching the corresponding dimensions of the semiconductor dice to be secured thereto, with the result being a continuous decrease in the sizes of semiconductor device packages, many of which are so-called "chip-scale packages" exhibiting dimensions that are the same as or only slightly larger than those of the die thereof.

Nonetheless, when conventional wire bonding processes are used to electrically connect bond pads of a semiconductor die to corresponding contacts, or terminals, of an interposer to which the semiconductor die is back bonded, the terminals of the interposer must be positioned outside of the outer periphery of the semiconductor die. This requirement prevents a reduction in the size of these interposers to dimensions that are substantially the same as those of the semiconductor die to be secured thereto and carried thereby.

Moreover, in order to securely attach a semiconductor die to the circuit board, it is typically desirable that a sufficient amount of adhesive material be used to form a confluent adhesive layer adjacent to the back side of the semiconductor die and a fillet around the entire outer periphery of the semiconductor die. Some excess adhesive material is typically required to adhere the semiconductor die and the circuit board to one another in this manner. When excess adhesive material is used, however, some of the adhesive material may flow outward from the semiconductor die, beyond the desired location for a fillet, and contaminate the connection surfaces of adjacent terminals, which are located at the same elevation as or just above a surface of the circuit board. If the connection surfaces of the terminals become contaminated in this manner, intermediate conductive elements, such as bond wires, may not adhere thereto or form an effective electrical connection, which may ultimately reduce the reliability of the packaged semiconductor device, or cause electrical shorting and failure of the packaged semiconductor device.

Larger circuit boards, such as so-called "motherboards" and the substrates of so-called "plug-and-play" devices or cards, may be configured to carry a plurality of semiconductor devices. As with interposers, the trend with such larger circuit boards is also toward ever-decreasing sizes and ever-increasing densities. Consequently, contamination of the connection surfaces of terminals by adhesive material is increasingly encountered when semiconductor devices are assembled with larger circuit boards.

Solder masks are often used on circuit boards to facilitate the formation of solder balls or bumps on selected terminals of the circuit boards while protecting other features thereof and preventing solder from wetting and adhering to other features of the circuit board. The solder masks that are used on circuit boards are typically fabricated from photoresists, using known photolithography processes. These solder masks may be left in place while semiconductor devices and other components are secured and electrically connected to the circuit board. Thus, a semiconductor device may be secured to a solder mask which is, in turn, secured to the circuit board to which the semiconductor device is to be electrically connected.

When conventional solder masks are used on conventional circuit boards, a portion of the adhesive material that secures a semiconductor device to the solder mask may still flow laterally outward, beyond the outer periphery of the semiconductor device and onto connection surfaces of the adjacent terminals of the circuit board.

Some solder masks have been configured with recesses to receive some of the excess adhesive material. Nonetheless, these recesses typically do not have great enough volumes to contain all of the excess adhesive material that is forced from beneath a semiconductor device as the semiconductor device is secured to the solder mask and, thus, to the circuit board. Consequently, the terminals of circuit boards are typically spaced a sufficient distance away from the location at which the outer periphery of a semiconductor device to be secured to the circuit board is to be positioned that the connection surfaces thereof will not be contaminated by adhesive material. Such positioning of the terminals undesirably requires that the circuit board include additional real estate, which prevents a reduction in the dimensions of the circuit board.

The inventors are not aware of any carrier substrates or solder masks therefor that are configured to prevent adhesive material from flowing onto the connection surfaces of the carrier substrate terminals while reducing the dimensions of the carrier substrate.

SUMMARY OF THE INVENTION

The present invention includes a solder mask for use on a carrier substrate, such as a circuit board. The solder mask is configured to receive adhesive and prevent the same from contacting or otherwise covering connection surfaces of the terminals of the circuit board or other carrier substrate.

A solder mask according to the present invention includes semiconductor device-securing regions and may include recesses adjacent to the device-securing regions and which are configured to receive adhesive material, dams that are configured to laterally surround terminals of the circuit board, or a combination thereof. If the solder mask includes one or more recesses, or recessed areas, each recess may extend partially through the solder mask or completely therethrough. The collective volume defined between the outer periphery of a semiconductor device positioned upon a particular device-securing region of the solder mask and the solder dams and/or recesses that are adjacent thereto may receive substantially all of the excess adhesive material that is used to secure the semiconductor device to that supporting region. Accordingly, the height at which the supporting region positions a semiconductor device, as well as the depths and lateral dimensions of the recesses, may be configured to provide a volume that will receive excess adhesive.

In addition, one or more of the solder dams of the solder mask may extend laterally over a peripheral portion of the connection surface of the terminal around which it is positioned. The laterally extending regions of each such solder dam may also provide additional surface area over which adhesive material may spread before spilling over onto the corresponding terminal of the circuit board.

A circuit board upon which the solder mask is configured to be disposed may include terminals that protrude from, or are raised or elevated relative to, a surface thereof, increasing the volume within which adhesive material may be received. The distance the terminals protrude from the surface of the circuit board may provide a particular, desired volume between their corresponding solder dams and the location at which the outer periphery of a semiconductor device secured over the circuit board will be positioned. As an increased volume of adhesive material may be received between raised terminals and the location at which the outer periphery of a semiconductor device will be positioned, the terminals may be placed closer to their corresponding die-attach location than the terminals of conventional circuit boards and interposers. In addition, the connection surfaces of the terminals may be located at an elevation that is closer to the elevation at which the bond pads or other contacts of a semiconductor device are positioned over the circuit board. As a result of one or both of the closer spacing and raised elevation of the raised terminals, the raised terminals of a circuit board that incorporates teachings of the present invention may facilitate the use of shorter intermediate conductive elements between bond pads or other contacts of a semiconductor device and their corresponding terminals of the circuit board.

As used herein, the term "circuit board" is not limited to particular structures such as conventional FR-4 resin boards but encompasses any conductor-carrying, substantially planar substrate or other die support member formed of any suitable material, including without limitation conductor-carrying laminates formed of various materials, silicon or glass substrates with deposited (as by photolithography) conductors, ceramic substrates and other suitable conductor carriers as known in the art. Further, the term "circuit board" includes and encompasses all types of single-die and multi-dice assemblies, such as multi-chip modules (MCMs) including different types of dice or the same die type, the latter being exemplified by single in-line memory modules (SIMMs) or dual in-line memory modules (DIMMs).

Known techniques, including the use of adhesive material and positioning one or more semiconductor devices over the circuit board and in contact with the adhesive material, may be used to secure a semiconductor device to a circuit board carrying a solder mask according to the present invention. Upon being brought into contact with the adhesive material, positive pressure exerted by the positioning device and/or gravity may cause adhesive material between a support region of the solder mask on the circuit board and the semiconductor device to flow laterally outward, beyond an outer periphery of the support region and/or the semiconductor device. A receptacle formed at least in part by the solder mask will receive adhesive that is forced outward during placement of the semiconductor device. The volume of each adhesive receptacle, as well as the heights of the solder dams of the solder mask that laterally surround corresponding terminals of the circuit board, prevent adhesive material from contaminating the terminals.

A semiconductor device assembly incorporating teachings of the present invention includes a circuit board with the solder mask thereon, as well as at least one semiconductor device positioned over and secured to a corresponding support region of the solder mask. Contacts of the semiconductor device may be electrically connected to corresponding terminals of the circuit board by way of intermediate conductive elements, such as leads, bond wires, and conductive tape-automated bond (TAB) elements carried by a dielectric film. The semiconductor device assembly may also be partially or fully encapsulated.

The present invention also includes methods for designing circuit boards and solder masks to be used on circuit boards. The circuit boards, solder masks, or combinations thereof are configured to prevent excess adhesive material from contaminating the connection surfaces of circuit board terminals, while facilitating the placement of circuit board terminals more closely to the location at which the outer periphery of a semiconductor device will be located than the terminals of a conventional circuit board may be placed relative to the location at which the outer periphery of a semiconductor device thereon will be located.

A method for designing a solder mask in accordance with the present invention includes configuring at least one device-securing region and at least one corresponding recess or a plurality of dams laterally adjacent thereto. Alternatively, a combination of dams and recesses may be configured, with the dams being located adjacent to at least one recess, opposite from the corresponding device-securing region. The heights of the at least one device-securing region and the solder dams that correspond thereto, as well as the depth and lateral dimensions of the at least one corresponding recess, may be configured to provide a desired adhesive receptacle volume.

Additionally, the present invention includes a method for designing a circuit board to minimize contamination of the terminals thereof by excess adhesive. Such a method includes configuring terminals of the circuit board to protrude from a surface of the circuit board a distance that will provide a desired adhesive receptacle volume laterally between the terminals and a corresponding semiconductor device once the semiconductor device has been secured to the circuit board, while facilitating the connection of intermediate conductive elements to the terminals after the semiconductor device has been secured to the circuit board.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which depict various aspects of exemplary embodiments of the present invention.

DETAILED DESCRIPTION OF THE INVENTION

Figure 1:
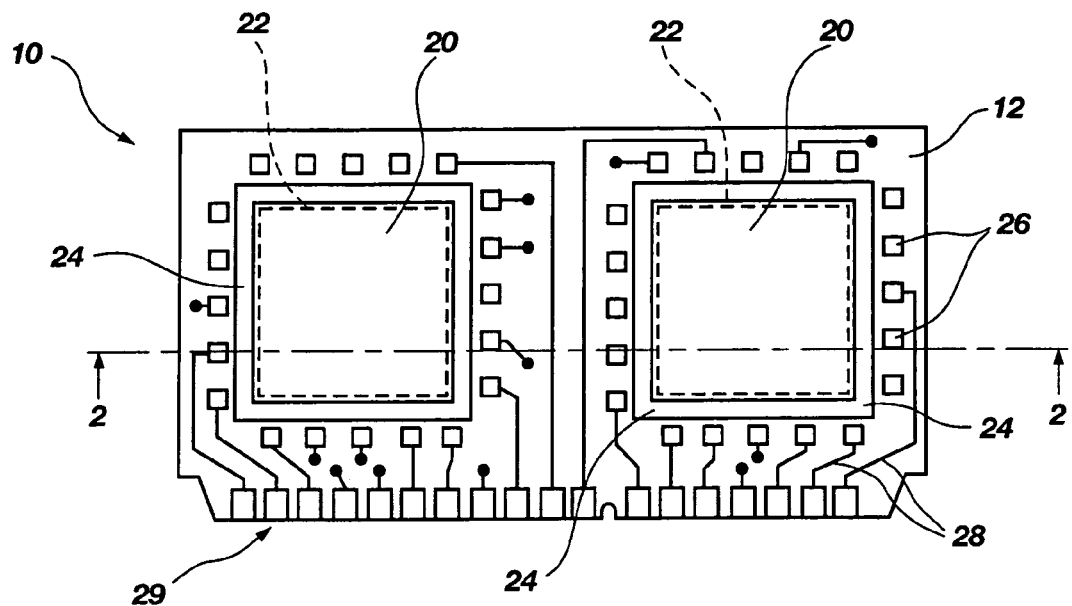
FIG. 1 is a top view of an exemplary circuit board according to the present invention, which includes terminals that protrude from at least one surface thereof.
Figure 2:
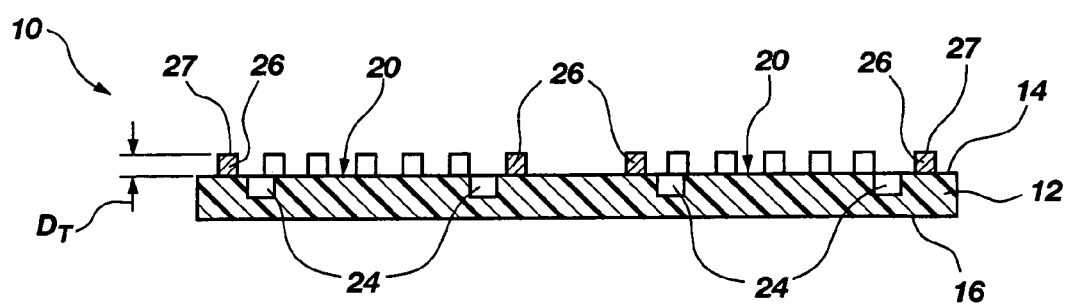
FIG. 2 is a cross-section taken along line 2—2 of FIG. 1.

With reference to FIGS. 1 and 2, an exemplary embodiment of a circuit board 10 is depicted which incorporates teachings of the present invention. The depicted circuit board 10 includes a substantially planar substrate 12 with a plurality of die-attach locations 20 on at least one surface 14 thereof. Terminals 26 that correspond to each die-attach location 20 are positioned laterally adjacent thereto, adjacent to a periphery 22 of an area of surface 14 that will be occupied by a semiconductor device (not shown in FIG. 1 or FIG. 2) that will be secured to the corresponding die-attach location 20. Circuit board 10 may also include at least one recessed area 24 located at least partially between each die-attach location 20 and at least some of its corresponding terminals 26.

Substrate 12 of circuit board 10 may be formed from one or more layers of any suitable material (e.g., FR-4 resin). In addition to terminals 26, a plurality of conductive traces 28 that communicate with terminals 26 may be carried upon one or both surfaces 14 and 16 of circuit board 10, or internally thereby if substrate 12 comprises a multi-layer laminate structure. As is well known in the art, conductive traces 28 are arranged in such a way as to establish communication between the leads of contacts (not shown in FIG. 1 or FIG. 2) of one or more of the semiconductor devices (also not shown in FIG. 1 or FIG. 2) that are electrically connected thereto and other components, such as the peripheral componentry of a computer, other semiconductor devices, or the like, which may be carried by circuit board 10 or external thereto. To establish communication between the leads or contacts of a semiconductor device that has been secured to circuit board 10 and componentry external to circuit board 10, conductive traces 28 may extend to connective elements 29 of circuit board 10, such as so-called "plug-and-play" type connectors, secondary terminals, conductive pins, or the like.

Although it is currently preferred that conductive traces 28 do not extend across a surface 14, 16 of circuit board 10 in the area of a die-attach location 20, circuit boards 10 that include die-attach locations 20 with circuit traces 28 extending thereacross are also within the scope of the present invention.

Figure 3:
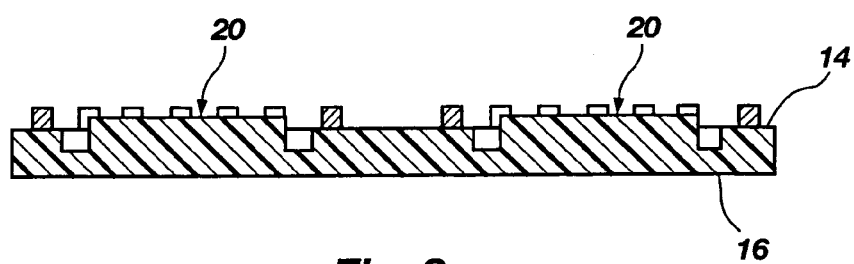
FIG. 3 is a cross-sectional representation of another exemplary circuit board which includes a raised die-attach location.

Each die-attach location 20 of circuit board 10 is an area over which a semiconductor device is to be physically secured. By way of example only, bare semiconductor devices, packaged semiconductor devices, or multi-chip assemblies may be secured over each die-attach location 20. Die-attach locations 20 may reside in substantially the same plane as their corresponding surface 14, 16, as shown in FIGS. 1 and 2, or they may be raised somewhat relative to their corresponding surface 14, 16 and, thus, reside in a different plane than that surface 14, 16, as depicted in FIG. 3.

Terminals 26 of circuit board 10 are arranged on a surface 14, 16 thereof in such a way as to facilitate the placement of intermediate conductive elements (not shown in FIG. 1 or FIG. 2), such as leads, bond wires, or conductive tape-automated bonding (TAB) elements comprising conductive traces carried upon a flexible dielectric substrate, in desired orientations between each terminal 26 and its corresponding bond pad of an adjacent semiconductor device (not shown in FIG. 1 or FIG. 2). Each terminal 26 of circuit board 10 includes a connection surface 27 to which the corresponding intermediate conductive element is secured to establish electrical communication between that terminal 26 and its corresponding bond pad.

At least some terminals 26 of circuit board 10 protrude from the surface 14, 16 upon which they are carried. Each such terminal 26 may protrude above its corresponding surface 14, 16 by a distance $D_T$ that will prevent excess adhesive material (not shown in FIG. 1 or FIG. 2), which may be used for securing a semiconductor device to its corresponding die-attach location 20, from flowing onto and, thus, contaminating connection surface 27 of that terminal 26. In addition, connection surface 27 of each protruding terminal 26 may be positioned at an elevation above its corresponding surface 14, 16 that facilitates the connection of one or more intermediate conductive elements thereto. The raised height of each connection surface 27, as well as the possibly closer positioning of each terminal 26 relative to its corresponding die-attach location 20, may facilitate the use of shorter intermediate conductive elements between each terminal 26 and its corresponding bond pad or other contact of a semiconductor device as the semiconductor device is secured and electrically connected to circuit board 10.

Terminals 26 of circuit board 10 may be fabricated by any suitable, known technique. By way of example only, an electrolytic process that employs known dry film techniques and copper filling or plating may be used to form terminals 26. Also, each terminal 26 may be plated with a material, such as gold or another so-called "noble metal," nickel, or a combination of different plating layers, that may enhance the adhesion and electrical connection characteristics of an intermediate conductive element thereto. Such plating may also be effected by known processes, such as by electrolytic, electroless, or immersion plating techniques.

Figure 4:
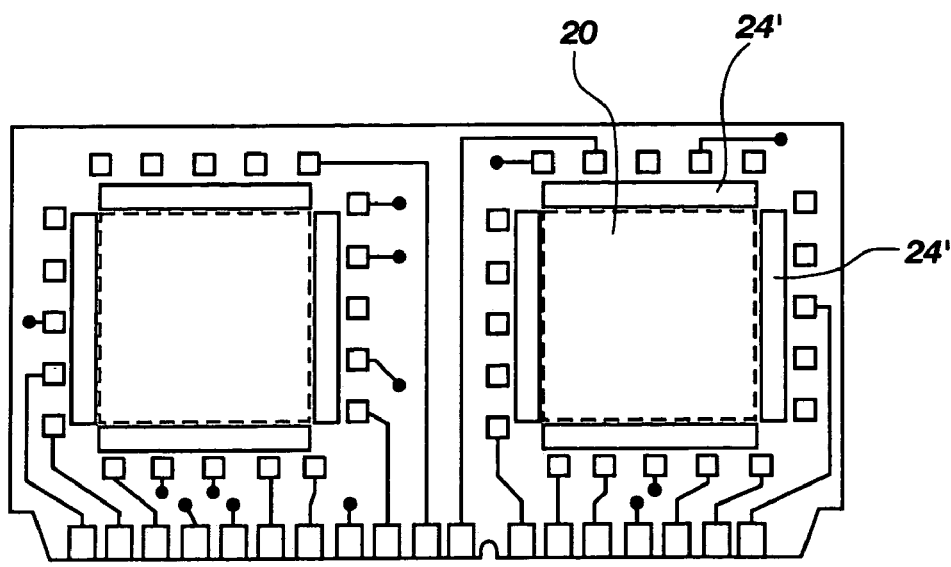
FIG. 4 is a top view of a circuit board with each recessed area thereof being positioned adjacent to a portion of the periphery of a die-attach location thereof.

If circuit board 10 also includes one or more recessed areas 24, each recessed area 24 may be sized and configured to receive at least some of the excess adhesive material that is forced outwardly from a die-attach location 20 of circuit board 10 as a semiconductor device is secured in position thereover. Each recessed area 24 may substantially laterally surround its corresponding die-attach location 20, as depicted in FIGS. 1 and 2. Alternatively, as shown in FIG. 4, one or more discrete recessed areas 24' may be positioned laterally around only portions of a corresponding die-attach location 20. Further, each recessed area 24, 24' may extend into its corresponding die-attach location 20 so as to overlap periphery 22 and to extend at least partially beneath a semiconductor device when the semiconductor device is secured into position over that die-attach location 20 (see FIG. 10). Recessed areas 24, 24' may also laterally extend substantially to a periphery of each terminal 26 that corresponds to the corresponding die-attach location 20, thereby effectively increasing the height of each such terminal 26 for purposes of preventing excess adhesive material from flowing onto and contaminating connection surface 27 thereof.

Figure 5:
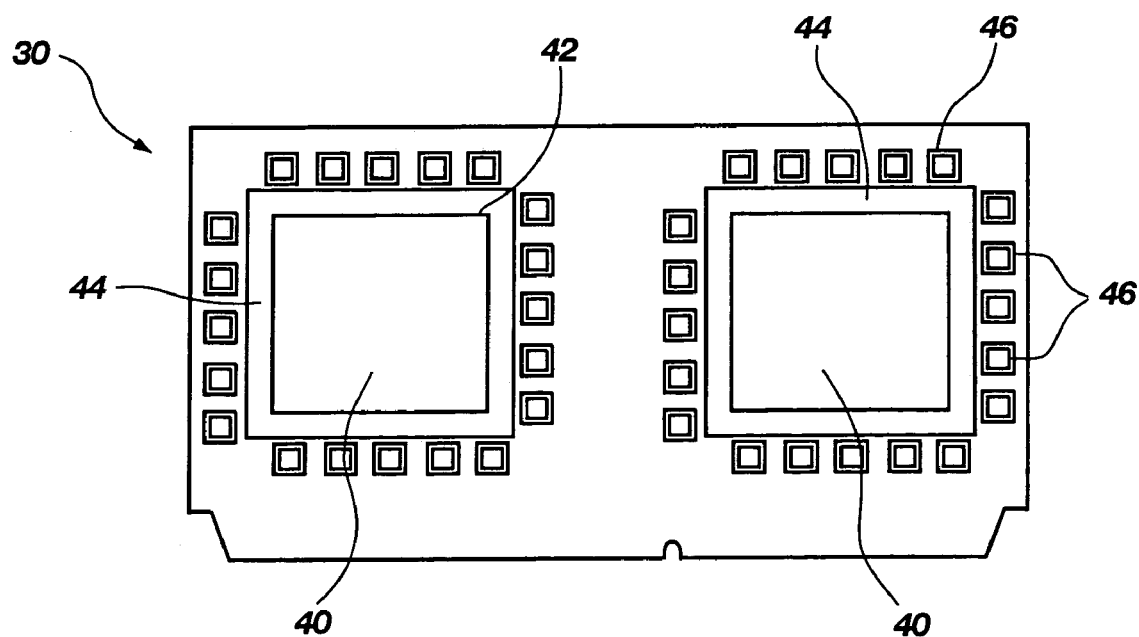
FIG. 5 is a top view of an exemplary solder mask according to the present invention.

Turning now to FIG. 5, an exemplary embodiment of a solder mask 30 for use on a surface of a circuit board, such as circuit board 10 of FIGS. 1 and 2, is illustrated. Solder mask 30 includes a plurality of dams 46 that are configured to laterally surround corresponding terminals (e.g., terminals 26 of circuit board 10, shown in FIGS. 1 and 2) of the circuit board. As shown in FIG. 5, solder mask 30 may also include a plurality of device-securing regions 40 to which semiconductor devices may be secured. Also, if solder mask 30 includes one or more device-securing regions 40, it may also include at least one recessed area 44 adjacent to each device-securing region 40.

Solder mask 30 is configured to prevent solder or another electrically conductive joint-forming material (e.g., a conductive elastomer, conductor-filled epoxy, etc.) (not shown) from contacting various features of a circuit board. Thus, solder mask 30 prevents such conductive joint-forming materials from damaging the circuit board, as well as from wetting and, thus, adhering to and potentially causing electrical shorting between electrically conductive features of the circuit board or structures carried thereby, such as conductive traces of the circuit board, connective elements of the circuit board, and devices that have already been secured to the circuit board, as well as other terminals of the circuit board to which bond wires or conductive TAB elements are to be subsequently secured.

Each dam 46 of solder mask 30 contacts at least a portion of a periphery of a corresponding terminal of the circuit board (e.g., a terminal 26 of circuit board 10) so as to prevent solder from flowing between that dam 46 and its corresponding, adjacent terminal 26. Also, the distance $D_D$ (FIG. 8) each dam 46 protrudes above a laterally adjacent location of solder mask 30 prevents excess quantities of the adhesive material (not shown in FIG. 5) which is used to secure a semiconductor device (not shown in FIG. 5) to the circuit board over which solder mask 30 is positioned from flowing onto and, thus, from contaminating its corresponding terminals.

Figure 10:
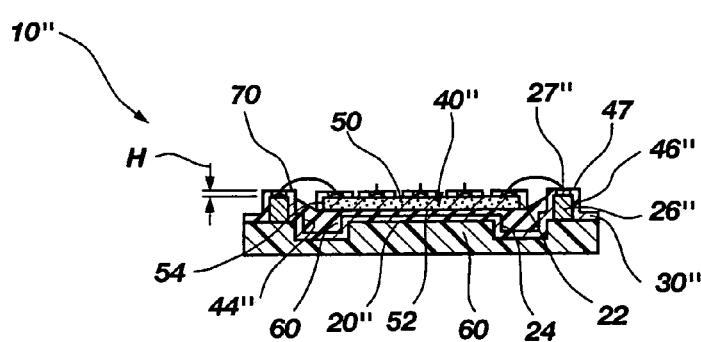
FIG. 10 is cross-section taken along line 10—10 of FIG. 9.

As depicted in FIG. 10, each dam 46" may include a laterally extending ledge 47 which is configured to extend over a peripheral edge of the connection surface of its corresponding terminal (e.g., connection surface 27 of terminal 26). Ledge 47 may be configured to further prevent excess adhesive material from flowing onto and contaminating the connection surface without impeding connection of an intermediate conductive element thereto. Thus, the height H of ledge 47 relative to the connection surface 27 of the adjacent terminal 26 may be small enough, and the area and shape of the connection surface 27 that is exposed through or laterally beyond ledge 47 may be large enough, to permit connection equipment (e.g., a wire bonding capillary) to access the connection surface.

As shown in FIG. 5, each dam 46 is configured to surround the entire periphery of its corresponding terminal. Also, each dam 46 includes a ledge 47 (FIG. 10) that extends over the entire peripheral edge of the connection surface of its corresponding terminal.

Each device-securing region 40 of solder mask 30 is positionable over a corresponding die-attach location of the circuit board (e.g., a die-attach location 20 of circuit board 10) over which solder mask 30 is to be positioned. Dams 46 of solder mask 30 that correspond to a particular device-securing region 40 may be positioned laterally adjacent to that device-securing region 40.

Each device-securing region 40 of solder mask 30 is configured to receive a semiconductor device, such as a bare semiconductor device, a packaged semiconductor device, or a multi-chip assembly, and to have the semiconductor device secured thereto. By way of example only, an adhesive material, such as a suitable epoxy, thermoset resin, or pressure-sensitive adhesive, may be used to secure a semiconductor device to a device-securing region 40 of solder mask 30. If the adhesive material is in a liquid or semisolid state as the semiconductor device is positioned over device-securing region 40, some of the adhesive material may be forced from between the semiconductor device and device-securing region 40, laterally beyond an outer periphery of the semiconductor device, and toward dams 46 and their corresponding terminals of the circuit board that underlies solder mask 30.

To further reduce the likelihood that such excess adhesive material will flow over dams 46 and contaminate the connection surfaces of their corresponding terminals, one or more recessed areas 44 may be provided between each device-securing region 40 and at least some of its corresponding dams 46. Each recessed area 44 may have dimensions that are configured to receive substantially all of the excess adhesive material that is forced from between a semiconductor device and the adjacent device-securing region 40 when the semiconductor device is secured to device-securing region 40.

Figure 6:
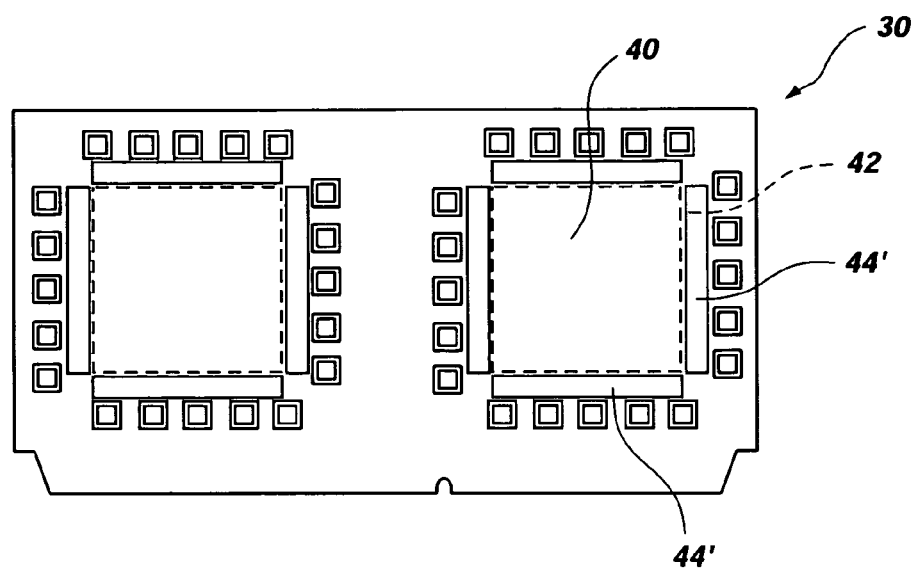
FIG. 6 is a top view of another exemplary solder mask of the present invention, each recessed area of which is located adjacent to only a portion of the periphery of a device-securing region thereof.

As shown in FIG. 5, a single recessed area 44 laterally surrounds an outer periphery 42 of each device-securing region 40. Alternatively, as depicted in FIG. 6, one or more recessed areas 44' may be positioned adjacent to only portions of an outer periphery 42 of a corresponding device-securing region 40 of solder mask 30. In either event, as shown in FIG. 10, one or more recessed areas 44" may extend beneath the location at which an outer periphery of a semiconductor device will be positioned when the semiconductor device is secured to device-securing region 40.

Solder mask 30 may comprise a preformed element that is configured to be aligned relative to, positioned over, and secured (e.g., with an adhesive material) to a complementary circuit board. Alternatively, solder mask 30 may be formed on the circuit board.

A variety of known, suitable processes may be employed to form solder mask 30 either separately from or on a circuit board. By way of example only, known photolithography techniques, which include the use of a liquid photoresist material, a pattern on a reticle to be copied to a layer of the photoresist material, radiation of a suitable wavelength for exposing selected regions of the layer of photoresist material through the reticle, and resist-developing chemicals that are appropriate for use with the photoresist material, may be used to form solder mask 30. Dry film photoresist materials are also known and suitable for use in the present invention may be employed. As another example, stereolithographic techniques may be used to form solder mask 30 from one or more layers of a photocurable polymer by selectively exposing regions of each layer of photocurable polymer, one layer at a time, to cure the selectively exposed regions.

Figure 7:
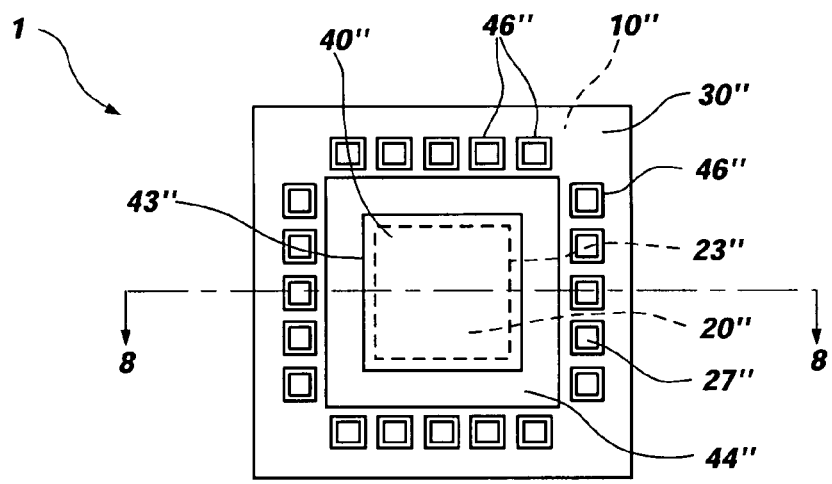
FIG. 7 is a top view of an exemplary circuit board assembly of the present invention which includes a circuit board and a solder mask.
Figure 8:
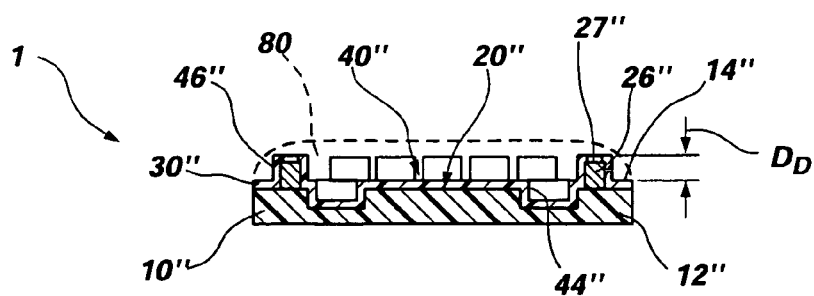
FIG. 8 is a cross-section taken along line 8—8 of FIG. 7.

Turning now to FIGS. 7 and 8, an example of a circuit board assembly 1 is depicted which includes a circuit board 10" and a solder mask 30" that incorporate teachings of the present invention.

As shown, circuit board 10" includes a substrate 12" with a single die-attach location 20" on a substantially planar surface 14" thereof. A plurality of terminals 26" is positioned around and adjacent to a periphery 23" of die-attach location 20". Each of terminals 26" protrudes from surface 14" to substantially the same elevation relative to (e.g., over) surface 14".

Solder mask 30", which substantially covers surface 14", includes a single device-securing region 40" that is aligned with and positioned over at least a portion of die-attach location 20" of circuit board 10". In addition, dams 46" of solder mask 30" are aligned with and positioned laterally around corresponding terminals 26" of circuit board 10". As shown, dams 46" may substantially laterally surround terminals 26", with only connection surface 27" of each terminal 26" or a portion thereof being exposed through each dam 46". A recessed area 44" is positioned between each peripheral edge 43" of device-securing region 40" and dams 46" that are located adjacent to that peripheral edge 43". Thus, each recessed area 44" is positioned over circuit board 10" so as to extend laterally from a die-attach location 20" thereof to terminals 26" that correspond to that die-attach location 20".

Figure 9:
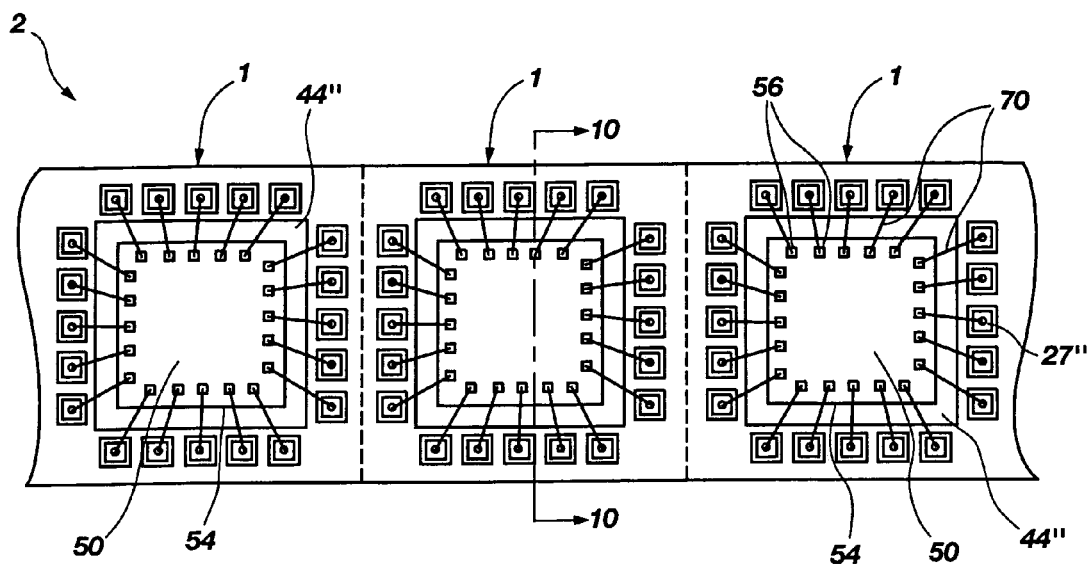
FIG. 9 is a top view of the circuit board assembly of FIG. 7 with a semiconductor device secured and electrically connected thereto.

In FIGS. 9 and 10, assembly and electrical connection of semiconductor devices 50 with a strip 2 comprising a plurality of unsevered circuit board assemblies 1 are described.

Semiconductor device 50 may comprise a bare semiconductor die, as depicted, or a packaged semiconductor device. Also, semiconductor device 50 may comprise a single semiconductor die or a multi-chip assembly. A quantity of a suitable adhesive material 60, such as a two-stage epoxy, a thermoset resin, or a pressure-sensitive adhesive material, may be applied to one or both of a bottom surface 52 of a semiconductor device 50 (i.e., the back side of the depicted semiconductor die) and a device-securing region 40" of solder mask 30". As a semiconductor device 50 is positioned adjacent to (e.g., over) its corresponding device-securing region 40", some adhesive material 60 therebetween may be forced beyond an outer periphery 54 of semiconductor device 50, toward dams 46" of solder mask 30" and their corresponding terminals 26" of circuit board 10". This excess adhesive material 60 is received within recessed areas 44", as well as between outer periphery 54 of semiconductor device 50 and dams 46" of solder mask 30" that are positioned adjacent to associated terminals 26" of circuit board 10". The volume defined by recessed areas 44", outer periphery 54 of semiconductor device 50, and dams 46" of solder mask 30" is preferably sufficient to receive substantially all of the excess adhesive material 60 forced from between semiconductor device 50 and device-securing region 40" of solder mask 30". Thus, this collective volume preferably prevents adhesive material 60 from flowing onto exposed portions of connection surfaces 27" of adjacent terminals 26".

Any combination of raised terminals 26, 26" and dams 46, 46", recessed areas 24, 24' of a circuit board 10, 10" and recessed areas 44, 44" of a solder mask 30, 30" of the present invention may prevent adhesive material 60 from contaminating connection surfaces 27, 27" of terminals 26, 26". Accordingly, each of these features of the present invention facilitates the placement of terminals 26, 26" in closer proximity to their corresponding die-attach location 20, 20" than the terminals of conventional circuit boards may be positioned relative to their corresponding die-attach locations.

Once a semiconductor device 50 has been positioned and properly oriented relative to the appropriate locations of circuit board 10" and solder mask 30", adhesive material 60, if a curable material, may be partially or substantially cured, as appropriate for the type of adhesive material 60 used, to securely maintain the position of semiconductor device 50 on device-securing region 40". In addition, intermediate conductive elements 70, such as the bond wires that are shown, leads, or conductive TAB elements carried by a dielectric film, may be positioned or formed between bond pads 56 of semiconductor device 50 and their corresponding terminals 26" of circuit board 10".

Following the placement or formation of intermediate conductive elements 70 between bond pads 56 of semiconductor device 50 and their corresponding terminals 26" of circuit board 10", semiconductor device 50, intermediate conductive elements 70, and, optionally, circuit board 10" may be fully or partially encapsulated, as known in the art. By way of example only, a so-called "glob top" type encapsulant material 80 may be disposed on semiconductor device 50 and intermediate conductive elements 70 (FIG. 8). Alternatively, semiconductor device 50, intermediate conductive elements 70, and at least adjacent portions of circuit board 10" may be encapsulated in a molded package.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A solder mask for use on a carrier substrate, comprising:
    at least one device-securing region on an upper surface of the solder mask;
    at least one dam on the upper surface of the solder mask and configured to be located between the at least one device-securing region and at least a portion of a terminal of the carrier substrate;
    at least one recessed area located between the at least one device-securing region and the at least one dam.

2. The solder mask of claim 1, wherein the at least one dam is configured to extend laterally over at least a peripheral edge portion of a connection surface of the terminal.

3. The solder mask of claim 1, wherein the at least one dam protrudes to at least about the same elevation as an elevation of the at least one device-securing region.

4. The solder mask of claim 1, wherein the at least one recessed area extends substantially laterally around the at least one device-securing region.

5. The solder mask of claim 1, wherein the at least one recessed area extends substantially laterally adjacent to only a portion of a periphery of the at least one device-securing region.

6. The solder mask of claim 1, wherein the at least one recessed area is configured to receive excess adhesive material forced from between a semiconductor device and the at least one device-securing region.

7. The solder mask of claim 1, wherein the at least one dam and the at least one recessed area have dimensions that are configured to prevent excess adhesive material forced from between a semiconductor device and the at least one device-securing region from contaminating a connection surface of the terminal.

8. The solder mask of claim 1, wherein the at least one device-securing region is configured to receive only a portion of a bottom surface of a semiconductor device positioned thereon.

9. A connection element for carrying at least one semiconductor device, comprising:
    a substantially planar substrate including:
        at least one terminal protruding from a surface of the substantially planar substrate; and
        at least one die-attach location; and
    a solder mask on the surface of the substantially planar substrate, the solder mask including:
        at least one device-securing region positioned over at least a portion of the at least one die-attach location of the substantially planar substrate; and
        at least one dam located between the at least one die-attach location and the at least one terminal.

10. The connection element of claim 9, wherein the at least one dam of the solder mask extends over at least a peripheral edge portion of a connection surface of the at least one terminal of the substantially planar substrate.

11. The connection element of claim 10, wherein the at least one dam of the solder mask is located at a higher elevation than the at least one device-securing region of the solder mask.

12. The connection element of claim 11, wherein the at least one terminal protrudes from the surface of the substantially planar substrate to at least the same elevation as an elevation the at least one device-securing region of the solder mask protrudes from the surface of the substantially planar substrate.

13. The connection element of claim 10, wherein the at least one terminal protrudes from the surface of the substantially planar surface a sufficient distance to prevent the connection surface thereof from being contaminated with excess adhesive material forced from between the at least one device-securing region and a semiconductor device upon securing of the semiconductor device to the at least one device-securing region.

14. The connection element of claim 9, wherein the substantially planar substrate further includes:
    at least one recessed area between the at least one die-attach location and the at least one terminal.

15. The connection element of claim 14, wherein the at least one die-attach location substantially laterally surrounds the at least one device-securing region.

16. The connection element of claim 14, wherein the at least one die-attach location is located laterally adjacent to only a portion of a periphery of the at least one device-securing region.

17. The connection element of claim 9, wherein the solder mask further includes:
    at least one recessed area located laterally adjacent to at least a portion of the at least one device-securing region.

18. The connection element of claim 17, wherein the at least one recessed area is configured to receive excess adhesive material forced from between a semiconductor device and the at least one device-securing region upon securing the semiconductor device to the at least one device-securing region.

19. The connection element of claim 17, wherein the at least one recessed area substantially laterally surrounds the at least one device-securing region.

20. The connection element of claim 17, wherein the at least one recessed area is positioned laterally adjacent to only a portion of a periphery of the at least one device-securing region.

21. The connection element of claim 9, wherein the at least one dam has a height configured to prevent excess adhesive material forced from between a semiconductor device and the at least one device-securing region from contaminating a connection surface of the at least one terminal.

22. The connection element of claim 9, wherein the at least one dam is configured to extend laterally over at least a peripheral edge portion of a connection surface of the at least one terminal.

23. The connection element of claim 9, wherein the at least one dam protrudes to at least the same elevation as an elevation to which the at least one terminal protrudes.

* * * * *

UNITED STATES PATENT AND TRADEMARK OFFICE
CERTIFICATE OF CORRECTION

| | |
|---|---|
| PATENT NO. | : 7,061,124 B2 |
| APPLICATION NO. | : 10/936304 |
| DATED | : June 13, 2006 |
| INVENTOR(S) | : Tan et al. |

It is certified that error appears in the above-identified patent and that said Letters Patent is hereby corrected as shown below:

On the face page, in field (57), under "Abstract", in column 2, line 10, after "solder" insert -- mask --.

Signed and Sealed this

Eighth Day of April, 2008

JON W. DUDAS
*Director of the United States Patent and Trademark Office*